United States Patent
Thapa et al.

(10) Patent No.: US 11,869,942 B2
(45) Date of Patent: Jan. 9, 2024

(54) HETEROEPITAXIAL WAFER AND METHOD FOR PRODUCING A HETEROEPITAXIAL WAFER

(71) Applicant: SILTRONIC AG, Munich (DE)

(72) Inventors: Sarad Bahadur Thapa, Burghausen (DE); Martin Vorderwestner, Unterreit (DE)

(73) Assignee: SILTRONIC AG, Munich (DE)

( * ) Notice: Subject to any disclaimer, the term of this patent is extended or adjusted under 35 U.S.C. 154(b) by 132 days.

(21) Appl. No.: 16/643,003

(22) PCT Filed: Aug. 16, 2018

(86) PCT No.: PCT/EP2018/072229
§ 371 (c)(1),
(2) Date: Feb. 28, 2020

(87) PCT Pub. No.: WO2019/042782
PCT Pub. Date: Mar. 7, 2019

(65) Prior Publication Data
US 2020/0203485 A1  Jun. 25, 2020

(30) Foreign Application Priority Data
Aug. 28, 2017  (EP) .................................... 17188124

(51) Int. Cl.
*H01L 29/15*  (2006.01)
*H01L 21/02*  (2006.01)
(Continued)

(52) U.S. Cl.
CPC ........ *H01L 29/155* (2013.01); *H01L 21/0254* (2013.01); *H01L 21/0262* (2013.01);
(Continued)

(58) Field of Classification Search
CPC ......... H01L 21/02381; H01L 21/02458; H01L 21/02507; H01L 21/0254; H01L 29/2003; H01L 29/205; H01L 29/7786
See application file for complete search history.

(56) References Cited

U.S. PATENT DOCUMENTS 7,115,896 B2 * 10/2006 Guo .................... H01L 21/0254
257/15
7,652,282 B2 * 1/2010 Yanagihara ......... H01L 21/0254
257/19

(Continued)

FOREIGN PATENT DOCUMENTS

EP       2819152 A    12/2014
TW       201631635 A   9/2016

OTHER PUBLICATIONS

Y. Cao et al., "GaN-on-Silicon Growth by MOCVD: A Mechanistic Approach to Wafer Scaling", CS Mantech Conference, May 19-22, 2014, Colorado, USA, pp. 261-264.

(Continued)

Primary Examiner — Jay C Kim
(74) Attorney, Agent, or Firm — BROOKS KUSHMAN P.C.

(57) ABSTRACT

A heteroepitaxial wafer comprises, in the following order: a silicon substrate having a diameter and a thickness;
  an AlN nucleation layer;
  a first strain building layer which is an $Al_zGa_{1-z}N$ layer having a first average Al content z, wherein $0<z$;
  a first strain preserving block comprising ≥5 and ≤50 units of a first sequence of layers, the first sequence comprising an AlN layer and at least two AlGaN layers, and having a second average Al content y, wherein y
  a second strain building layer which is an $Al_xGa_{1-x}N$ layer having a third average Al content x, wherein $0 \leq x < y$;

(Continued)

| 10 |
| 9 |
| 8 |
| 7 |
| 6 |
| 5 |
| 4 |
| 3 |
| 2 |
| 1 | a second strain preserving block comprising ≥5 and ≤50 units of a second sequence of layers, the sequence comprising an AlN layer and at least one AlGaN layer, and having a fourth average Al content w, wherein x<w<y, and a GaN layer, wherein the layers between the AlN nucleation layer and the GaN layer form an AlGaN buffer.

16 Claims, 6 Drawing Sheets

(51) Int. Cl.
- *H01L 29/20* (2006.01)
- *H01L 29/205* (2006.01)
- *H01L 29/778* (2006.01)

(52) U.S. Cl.
CPC .. *H01L 21/02381* (2013.01); *H01L 21/02458* (2013.01); *H01L 21/02507* (2013.01); *H01L 29/2003* (2013.01); *H01L 29/205* (2013.01); *H01L 29/7786* (2013.01)

(56) References Cited

U.S. PATENT DOCUMENTS

| | | | | |
|---|---|---|---|---|
| 8,247,796 B2 * | 8/2012 | Makabe | H01L 29/66462 | 257/77 |
| 8,247,842 B2 * | 8/2012 | Sato | H01L 21/02381 | 257/190 |
| 8,264,001 B2 * | 9/2012 | Sato | H01L 29/7787 | 257/190 |
| 8,742,396 B2 * | 6/2014 | Ooshika | H01L 33/04 | 257/15 |
| 8,748,866 B2 * | 6/2014 | Lee | H01L 33/14 | 257/13 |
| 8,946,773 B2 * | 2/2015 | Tak | H01L 21/02505 | 257/190 |
| 8,963,164 B2 * | 2/2015 | Shimizu | H01L 21/02507 | 257/77 |
| 8,981,382 B2 * | 3/2015 | Gao | H01L 29/2003 | 257/76 |
| 9,112,077 B1 * | 8/2015 | Liao | H01L 33/12 | |
| 9,184,242 B2 * | 11/2015 | Kaneko | H01L 21/0251 | |
| 9,202,873 B2 * | 12/2015 | Harada | H01L 33/0075 | |
| 9,679,974 B2 * | 6/2017 | Hikosaka | H01L 21/02458 | |
| 10,211,297 B2 * | 2/2019 | Liu | H01L 21/02458 | |
| 10,256,368 B2 * | 4/2019 | Eum | H01L 29/2003 | |
| 10,418,240 B2 * | 9/2019 | Lin | H01L 29/205 | |
| 10,586,701 B2 * | 3/2020 | Shikaguchi | H01L 29/7786 | |
| 10,727,303 B2 * | 7/2020 | Ikuta | H01L 29/155 | |
| 2008/0203382 A1 | 8/2008 | Yanagihara | | |
| 2011/0272665 A1 | 11/2011 | Yamaguchi et al. | | |
| 2012/0161152 A1 | 6/2012 | Miyoshi et al. | | |
| 2013/0092953 A1 | 4/2013 | Miyoshi et al. | | |
| 2014/0374771 A1 | 12/2014 | Umeno et al. | | |
| 2017/0154986 A1 | 6/2017 | Su et al. | | |
| 2017/0323960 A1 | 11/2017 | Sato et al. | | |

OTHER PUBLICATIONS

S. Stoffels et al., "The physical mechanism of dispersion caused by AlGaN/GaN buffers on Si and optimization for low dispersion," 2015 IEEE international Electron Devices Meeting (IEDM), 2015. 4 pages.

Rowena et al., IEEE Electron Device Letters, vol. 32, No. 11, Nov. 2011. 1 page.

* cited by examiner

HETEROEPITAXIAL WAFER AND METHOD FOR PRODUCING A HETEROEPITAXIAL WAFER

CROSS REFERENCE TO RELATED APPLICATIONS

This application is the U.S. National Phase of PCT Appln. No. PCT/EP2018/072229 filed Aug. 16, 2018, which claims priority to European Application No. 17188124.6 filed Aug. 28, 2017, the disclosures of which are incorporated in their entirety by reference herein.

BACKGROUND OF THE INVENTION

1. Field of the Invention

The invention relates to a heteroepitaxial wafer comprising in the following order: a silicon substrate, an AlN nucleation layer, an AlGaN buffer and a GaN layer. The invention further relates to a method for producing such a heteroepitaxial wafer.

2. Description of the Related Art

Lattice mismatch between the substrate and the layers deposited thereon and differences with respect to their thermal coefficient of expansion will lead to warping of the multi-layer structure during growth of the layers and during cooling of the layered substrate to room temperature. Warping of the wafer may induce the formation of cracks.

US 2014/0374771 A1 discloses a semiconductor multi-layer substrate, a semiconductor device and a method for manufacturing the same. The multi-layer substrate comprises a substrate made of silicon, a first warp control layer giving a predetermined warp to the substrate and a second warp control layer. An amount of increase in warp per unit thickness of the second warp control layer is smaller than an amount of increase in warp per unit thickness of the first warp control layer. An effect is obtained, namely that current leakage and current collapse can be restrained without increasing a crack density, and that production costs can be reduced.

Rowena et al. report that increasing the thickness of the buffer tends to suppress vertical leakage current and improves the breakdown performance of AlGaN/GaN high-electon-mobility (HEMT) devices ("Buffer Thickness Contribution to Suppress Vertical Leakage Current With High Breakdown Field (2.3 MV/cm) for GaN on Si" IEEE Electron Device Letters, VOL. 32, NO. 11, November 2011).

It is also known that the curvature increases when the thickness of the substrate decreases, and it was concluded accordingly that the growth of GaN on 150 mm and 200 mm substrates requires much larger compressive strain in the epitaxial films (Y.Cao et al., "GaN-on-Silicon Growth by MOCVD: A Mechanistic Approach to Wafer Scaling"; CS MANTECH Conference, May $19^{th}$-$22^{nd}$ 2014, Colorado, USA).

The inventors of the present invention found that there is still the need to solve various problems.

If the thickness of the AlGaN buffer is increased in order to improve the breakdown characteristics, wafer warp will increase, as well, all the more as when silicon substrates having comparatively large diameters of 150 mm or 200 mm or 300 mm and having thicknesses in accordance with the SEMI standard are used.

Large wafer warp during epi deposition causes temperature non-uniformity on the surface that ultimately results in layer thickness variation and material alloy fluctuation across the wafer diameter.

The present invention was made in order to address these problems.

SUMMARY OF THE INVENTION

The present invention is directed to a heteroepitaxial wafer comprising, in the following order:
a silicon substrate having a diameter and a thickness;
an AlN nucleation layer;
a first strain building layer which is an $Al_zGa_{1-z}N$ layer having a first average Al content z, wherein 0<z;
a first strain preserving block comprising not less than 5 and not more than 50 units of a first sequence of layers, the first sequence of layers comprising an AlN layer and at least two AlGaN layers, the first strain preserving block having a second average Al content y, wherein y>z;
a second strain building layer which is an $Al_xGa_{1-x}N$ layer having a third average Al content x, wherein 0≤x<y;
a second strain preserving block comprising not less than 5 and not more than 50 units of a second sequence of layers, the second sequence of layers comprising an AlN layer and at least one AlGaN layer, the second strain preserving block having a fourth average Al content w, wherein x<w<y, and
a GaN layer, wherein the layers between the AlN nucleation layer and the GaN layer form an AlGaN buffer.

The present invention is further directed to a method for producing a heteroepitaxial wafer, the method comprising steps in the following order:
providing a silicon substrate having a diameter and a thickness, and depositing a multiplicity of layers on the silicon substrate thereby forming a layered substrate, comprising
depositing on the silicon substrate an AlN nucleation layer;
depositing on the AlN nucleation layer a first strain building layer which is an $Al_zGa_{1-z}N$ layer having a first average Al content z, wherein 0<z;
depositing on the first strain building layer a first strain preserving block comprising not less than 5 and not more than 50 units of a first sequence of layers, the first sequence of layers comprising an AlN layer and at least two AlGaN layers, the first strain preserving block having a second average Al content y, wherein y>z;
depositing on the first strain preserving block a second strain building layer which is an $Al_xGa_{1-x}N$ layer having a third average Al content x, wherein 0≤x<y;
depositing on the second strain building layer a second strain preserving block comprising not less than 5 and not more than 50 units of a second sequence of layers, the second sequence of layers comprising an AlN layer and at least one AlGaN layer, the second strain preserving block having a fourth average Al content w, wherein x<w<y; and
depositing on the second strain preserving block a GaN layer.

BRIEF DESCRIPTION OF THE DRAWINGS

FIG. 3 qualitatively shows how curvature C of the layered substrate and thickness th of the layers correlate during the growth of the first sequence of layers (solid line) which FIG. 2 refers to.

DETAILED DESCRIPTION OF THE PREFERRED EMBODIMENTS

Preferably, the previously mentioned nitride containing layers are deposited by metalorganic chemical vapor deposition (MOCVD). As precursor compounds trimethyl gallium, trimethylaluminum and ammonia can be used. Hydrogen or nitrogen is a suitable carrier gas. The growth temperature of the nitride containing layers is preferably not less than 700° C. and not more than 1160° C.

The silicon substrate is preferably a silicon single crystal wafer having a diameter of 150 mm and a thickness of not more than 1000 µm, preferably not more than 675 µm, or having a diameter of 200 mm and a thickness of not more than 1200 µm, preferably not more than 725 µm, or having a diameter of 300 mm and a thickness of not more than 1500 µm, preferably not more than 775 µm. Preferably, the silicon substrate has {111}-orientation and a crystal offcut of less than or equal to 2°. Alternatively, the silicon substrate can have the mentioned orientation and offcut and be an SOI wafer (silicon-on-insulator wafer) or a layered wafer having a silicon single crystal top layer.

The AlN nucleation layer has a thickness which is preferably not less than 100 nm and not more than 300 nm. The curvature of the substrate becomes more negative, i.e. more concave with increasing thickness of the AlN nucleation layer.

The first strain building layer is an AlGaN layer having a first average Al content z, i.e. the first strain building layer is an $Al_zGa_{1-z}N$ layer, wherein 0<z. Alternatively, the first strain building layer can comprise more than one AlGaN layer with decreasing Al content in the growth direction. Preferably, the value of z is not less than 40% and not more than 60%. The first strain building layer forms an interface with the top surface of the AlN nucleation layer. The first strain building layer reduces the concave curvature so that the layered substrate becomes less concave under the conditions of growth of the first strain building layer. The concave curvature decreases the hinner the substrate is. Preferably, the curvature of the layered substrate remains concave in the course of growth of the first strain building layer. The thickness of the first strain building layer is preferably not less than 30 nm and not more than 200 nm.

The first strain preserving block comprises not less than 5 and not more than 50 units of a first sequence of layers. The first sequence of layers comprises an AlN layer and at least two AlGaN layers differing with regard to their Al content.

Preferably, the Al content of the top surface of the first strain building layer is equal to or more than the Al content of the closest AlGaN layer of the first strain preserving block. Moreover, it is preferable that the AlN layer of the first unit forms an interface with the top surface of the first strain building layer. The Al content decreases in the first sequence of layers with increasing distance from the substrate. Preferably, one AlGaN layer of the first sequence of layers is a graded composition AlGaN layer. The grading of the Al composition can be stepwise or continuous.

According to a preferred embodiment of the invention, the first sequence of layers in the growth direction consists of an AlN layer, a thick constant composition AlGaN layer, a continuously graded composition AlGaN layer, and, optionally, a thin constant composition AlGaN layer. The thickness of the thick constant composition AlGaN layer is at least twice the thickness of the continuously graded composition AlGaN layer and at least twice the thickness of the thin constant composition AlGaN layer. The Al content of the thin constant composition AlGaN layer is equal to or similar to the Al content of the top surface of the continuously graded AlGaN layer. The curvature of the layered substrate more rapidly increases during the growth of the continuously graded composition AlGaN layer than during the growth of the thick and thin constant composition layers. The curvature of the layered substrate can be readily controlled just by adapting the Al content and the thickness of the continuously graded composition AlGaN layer.

The first strain preserving block has a second average Al content which is y, wherein y>z. Preferably, the first strain preserving block is deposited until the curvature of the layered substrate becomes zero, or until the curvature of the layered substrate becomes less concave than at the beginning of the deposition of the first strain preserving block. While depositing the first strain preserving block, the change in curvature $\Delta C$ with respect to the change of the thickness $\Delta th$ of the first strain preserving block ($\Delta C/\Delta th$) preferably becomes positive in the beginning of the deposition and then becomes almost 'zero', i.e. remains almost constant or constant or even becomes negative. The thickness of the strain preserving block does not much influence the curvature of the layered substrate. Preferably, the growth of the first strain preserving block is stopped when the value of $\Delta C/\Delta th$ becomes less than $-5$ km$^{-1}$/µm.

The second strain building layer is an AlGaN layer having a third average Al content x, i.e. the second strain building layer is an $Al_xGa_{1-x}N$ layer, wherein 0≤x<y. It is preferable that the second strain building layer forms an interface with the top surface of the first strain preserving block, wherein the third average Al content is less than the Al content of the top surface of the first strain preserving block. The second strain building layer builds compressive strain, and the thickness and the Al content of the second strain building layer are chosen such that the curvature of the layered substrate becomes close to zero, i.e. preferably less than |3|km$^{-1}$ at the end of the deposition of the second strain building layer. Then, the layered substrate is almost flat after the second strain building layer has been grown. The thickness of the second strain building layer is preferably not less than 30 nm and not more than 200 nm.

The second strain preserving block comprises not less than 5 and not more than 50 units of a second sequence of layers. The second sequence of layers comprises an AlN layer and at least one AlGaN layer. It is preferable that the AlN layer of the first unit forms an interface with the top surface of the second strain building layer. The AlGaN layer of the second sequence of layers can be a constant composition AlGaN layer or a graded composition AlGaN layer, the Al decreasing with increasing distance from the substrate. The grading of the Al composition can be stepwise or continuous. According to a preferred embodiment of the invention, the AlGaN layer of the second sequence of layers is a constant composition AlGaN layer and its Al content is equal to or less than x. The second strain preserving block has a fourth average Al content which is w, wherein x<w<y.

Preferably, the second strain preserving block is deposited until the difference in curvature of the layered substrate to the beginning of the deposition of the second strain preserving block becomes negative.

The second strain preserving block does not substantially alter the curvature of the layered substrate. Preferably, the growth of the second strain preserving block is stopped when the value of $\Delta C/\Delta th$ is less than $-1\ km^{-1}/\mu m$, and the layered substrate stays almost flat after the second strain preserving block has been grown.

The GaN layer forms an interface with the top surface of the second strain preserving block or, alternatively, the GaN layer forms an interface with the top surface of an optional third strain building layer or, alternatively, the GaN layer forms an interface with the top surface of an optional superlattice block.

If present, the third strain building layer is an AlGaN layer having a fifth average Al content v, i.e. the third strain building layer is an $Al_vGa_{1-v}N$ layer, wherein $0 \leq v<w$. The third strain building layer forms an interface with the top surface of the second strain preserving block, wherein the fifth average Al content is preferably less than the Al content of the top surface of the second strain preserving block. The third strain building layer further builds up compressive strain and further increases the convex curvature of the layered substrate. The thickness of the second strain building layer is preferably not less than 30 nm and not more than 200 nm.

The implementation of strain building layers alternating with strain preserving blocks results in the provision of a comparatively thick AlGaN buffer while keeping the layered substrate almost flat, the wafer curvature not exceeding 25 $km^{-1}$ and without plastic deformation occurring.

In case that the superlattice block is present, the superlattice block forms an interface with either the top surface of the second strain preserving block (i.e. the third strain building layer is not present) or with the top surface of the third strain building layer.

The superlattice block preferably comprises not less than 10 and not more than 100 layer units, each comprising an AlN layer and an AlGaN layer. The AlN layer of the first unit of the superlattice block forms an interface with either the top surface of the second strain preserving block (i.e. the third strain building layer is not present) or with the top surface of the third strain building layer. The AlN layer of the unit of the superlattice block has a thickness which is preferably not less than 5 nm and not more than 10 nm. The AlGaN layer of the unit of the superlattice block has a thickness which is preferably 2 to 10 times the thickness of the AlN layer of the unit of the superlattice block. The AlGaN layer of the unit of the superlattice block has a content of Al which is equal to or less than the Al content of the AlGaN layer which is next underneath the superlattice block. The superlattice block has a sixth average Al content which is u, wherein v<u<w. The superlattice block allows moderately increasing the convex curvature of the layered substrate.

Regardless of whether the third strain building layer and/or the superlattice block is present or not, the AlGaN buffer has an average Al content which is preferably not less than 30%. Moreover, the AlGaN buffer has a thickness which is preferably not less than 1.0 μm and not more than 5 μm.

The GaN layer can be a high purity GaN layer which is not intentionally doped and has a carbon concentration which is preferably less than $1 \times 10^{18}$ atoms/cm$^3$ and has a thickness which is preferably not less than 50 nm and not more than 500 nm.

Preferably, the GaN layer comprises an insulating GaN buffer containing carbon and the high purity GaN layer. In case that the insulating GaN buffer is present, the high purity GaN layer forms an interface with the insulating GaN buffer, and the insulating GaN buffer forms an interface with the second strain preserving block or the third strain building layer or the superlattice block.

The concentration of carbon in the insulating GaN buffer is preferably not less than $1 \times 10^{18}$ atoms/cm$^3$ and not more than $1 \times 10^{20}$ atoms/cm$^3$. The insulating GaN buffer has a thickness which is preferably not less than 500 nm and not more than 2000 nm.

The deposition of the GaN layer is preferably started at a point in time, when the curvature of the layered substrate is convex and not more than 50 $km^{-1}$.

Regardless whether the insulating GaN buffer is present or not, the top surface of the GaN layer has a root mean square (RMS) roughness which is preferably less than 0.5 nm on 5 μm×5 μm atomic force microscope (AFM) scan area, and the full width at half maximum (FWHM) of X-ray diffraction (XRD) rocking curve for 002 and 102 reflections of the GaN layer is preferably less than 650 arcsec and 1200 arcsec, respectively.

The heteroepitaxial wafer according to the invention has excellent material properties regarding warp. For example, with an epilayer having a thickness of 4.5 μm, the epilayer is crack-free (3 mm edge exclusion considered), and the warp of the heteroepitaxial wafer is less than |50|μm.

Due to a high breakdown field which is more than 2.5 MV/cm for a vertical leakage current of 1 mA/mm$^2$ on (111)-oriented silicon having a diameter of at least 150 mm, the heteroepitaxial wafer according to the invention can be used to build 600 V HEMT (high electron mobility transistor) devices thereon.

For this purpose, a device layer may be formed on top of the GaN layer. The device layer may comprise, for example, pGaN/AlGaN layers or SiN/AlGaN layers or SiN/AlGaN/AlN layers or GaN/AlGaN/AlN layers or GaN/AlGaN layers or an AlGaN layer.

Definitions

Layered substrate means the substrate and at least one layer deposited thereon. Epilayer means the total of the layers grown on the substrate.

AlGaN buffer means the total of layers situated above the AlN nucleation layer and below the GaN layer.

Heteroepitaxial wafer means the entity comprising the substrate, the AlN nucleation layer, the AlGaN buffer and the GaN layer.

The Al content or average Al content of a layer can be specified as percentage of Al atoms present relative of the total sum of group III atoms present.

Curvature means the reciprocal of a radius of curvature of the layered substrate or the heteroepitaxial wafer, respectively.

Warp means the difference between the maximum and minimum distances of the median surface of a wafer from a reference plane.

The invention is further explained with reference to drawings.

Figure 1:
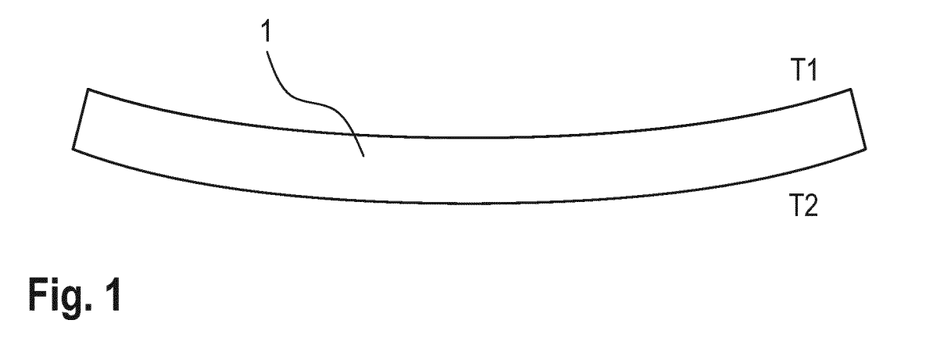
FIG. 1 displays a curved silicon substrate under thermal conditions of the deposition of a group III-nitride layer.

LIST OF REFERENCE NUMERALS EMPLOYED 1 silicon substrate
2 AlN nucleation layer
3 first strain building layer
4 first strain preserving block
5 second strain building layer
6 second strain preserving block
7 third strain building layer
8 superlattice block
9 GaN layer
9a carbon doped GaN layer
9b unintentionally doped GaN layer
10 device layer
10a AlGaN barrier layer
10b SiN passivation layer
11 metal pad
20 AlN layer
30 constant composition AlGaN layer
40 continuously graded AlGaN layer
50 thin constant composition AlGaN layer The silicon substrate 1 is heated from the backside (FIG. 1). While heating, the temperature T1 at the top surface is less than temperature T2 at the bottom surface of the silicon substrate 1. This negative temperature gradient ΔT (T1-T2) results in a concave shape of the substrate 1, i.e. in negative substrate curvature prior to group-III nitride deposition, the negative curvature increasing with increasing substrate temperature.

Regardless whether the curvature is concave or convex, the temperature at the top surface varies along the radial position and the deposition conditions vary, as well. As a consequence, the material characteristics of a group-III nitride layer deposited on the top surface becomes radially inhomogeneous depending on the grade of curvature.

The present invention avoids excessive curvature of the layered substrate resulting in homogeneous material characteristics of the layers and, at the same time, enables high breakdown field.

Figure 2:
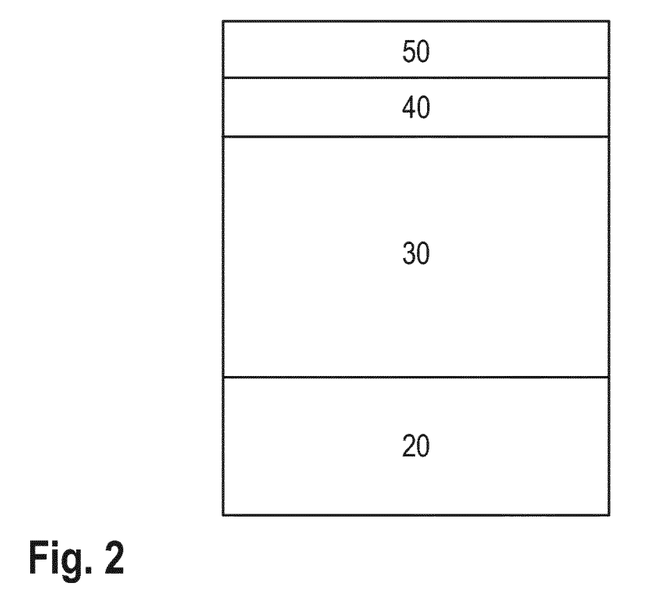
FIG. 2 schematically displays a first sequence of layers of a first strain preserving block according to a preferred embodiment of the invention.

FIG. 2 schematically displays a first sequence of layers of a first strain preserving block according to a preferred embodiment of the invention. The displayed first sequence of layers consists of an AlN layer 20, a thick constant composition AlGaN layer 30, a continuously graded AlGaN layer 40 and a thin constant composition AlGaN layer 50.

Due to this structure, the second average Al content y of the first strain preserving block is dominated by the Al contents of the AlN layer 20 and the thick constant composition AlGaN layer 30, and consequently, is comparatively high. This results in high breakdown field, helps reducing internal stress within the GaN layer and keeps the thermal expansion rate of the constant composition AlGaN layer 30 closer to that of the silicon substrate.

Figure 3:
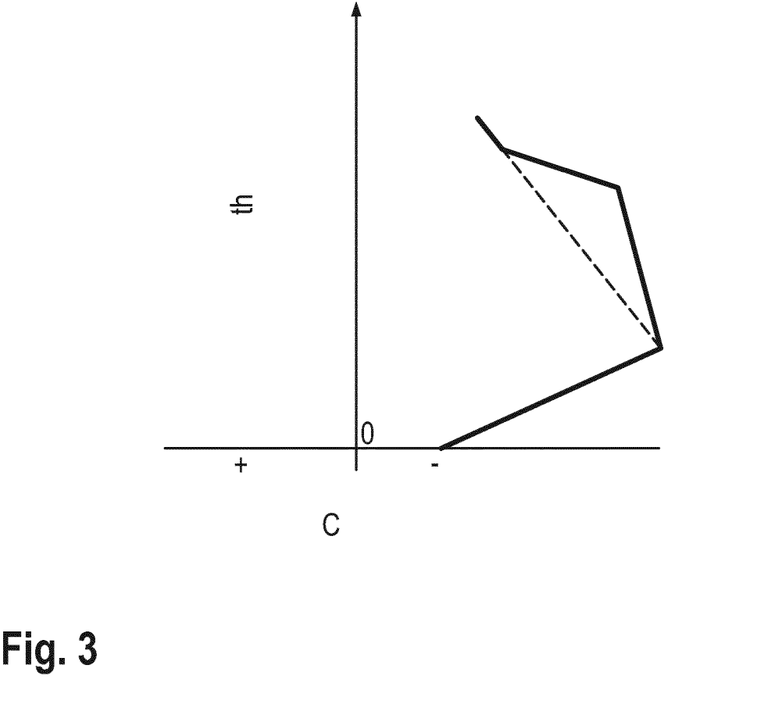

FIG. 3 qualitatively shows how curvature C of the layered substrate and thickness th of the layers correlate during the growth of the first sequence of layers (solid line) which FIG. 2 refers to. For the purpose of comparison, the continuously graded AlGaN layer 40 was omitted. Then, in order to obtain the same curvature of the layered substrate (dotted line), the Al content of the thick AlGaN layer 30 could be reduced or the thickness of the AlN layer 20 could be reduced. However, this would result in lowering the breakdown voltage of the AlGaN buffer and in increasing the leakage current.

Figure 4:
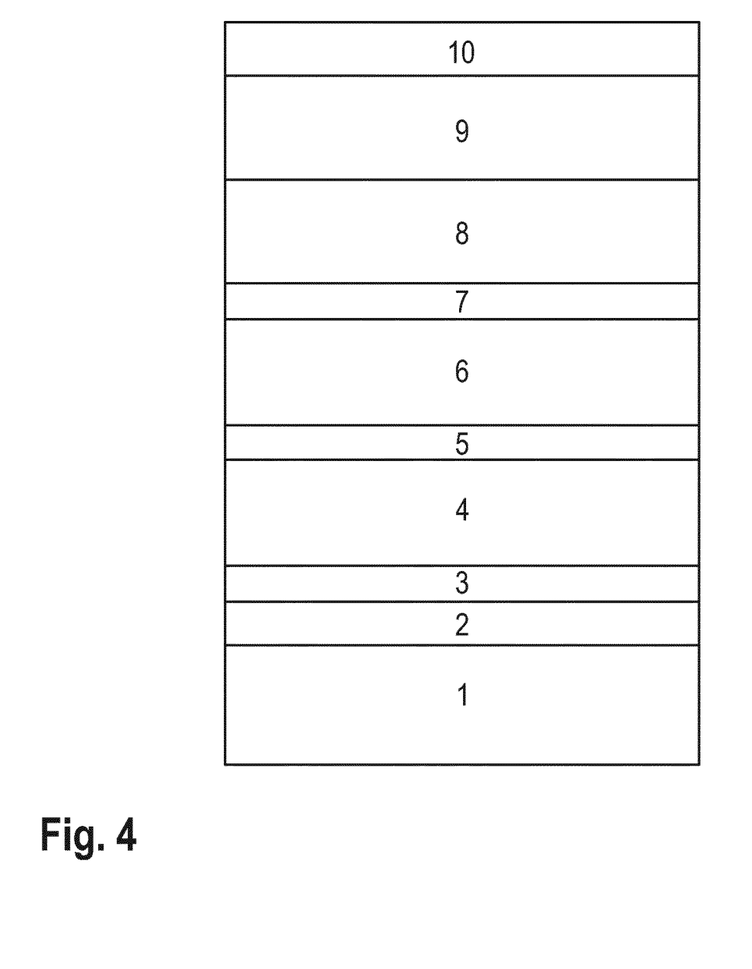
FIG. 4 schematically displays the structure of a heteroepitaxial wafer according to a preferred embodiment of the invention.

FIG. 4 schematically displays the structure of a heteroepitaxial wafer according to a preferred embodiment of the invention which additionally comprises a device layer. The heteroepitaxial wafer according FIG. 4 consists of a silicon substrate 1, an AlN nucleation layer 2, a first strain building layer 3, a first strain preserving block 4, a second strain building layer 5, a second strain preserving block 6, a third strain building layer 7, a superlattice block 8, a GaN layer 9 and a device layer 10.

A heteroepitaxial wafer according to FIG. 4 may have, for example, the following structure:
the silicon substrate 1 is a (111)-oriented silicon single crystal wafer having a diameter of 150 mm and a thickness of 675 μm;
the AlN nucleation layer 2 has a thickness of 200 nm;
the first strain building layer 3 is an $Al_zGa_{1-z}N$ layer having a thickness of i nm;
the first strain preserving block 4 consists of 30 repeated units of the first sequence of layers, the layers of a unit having the following order with respect to increasing distance to the silicon substrate: an AlN layer having a thickness of j nm, an $Al_aGa_{1-a}N$ layer having a thickness of k nm (where k>j), a continuously graded AlGaN layer having a thickness of l nm (where l<k) with an Al content decreasing from a % to b % and an $Al_bGa_{1-b}N$ layer having a thickness of m nm (where m>l), the average Al content of a unit being y, where y>z;
the second strain building layer 5 is an $Al_xGa_{1-x}N$ (where x<y) layer having a thickness of n nm;
the second strain preserving block 6 consists of 40 repeated units of the second sequence of layers, the layers of a unit having the following order with respect to increasing distance to the silicon substrate: an AlN layer having a thickness of j nm and an $Al_cGa_{1-c}N$ (where c<b) layer having a thickness of p nm, the average Al content of a unit being w, where w>x and w<y; the third strain building layer 7 is an $Al_vGa_{1-v}N$ (where v<w) layer having a thickness of q nm;
the superlattice block 8 consists of 25 repeated units of layers, the layers of a unit having the following order with respect to increasing distance to the silicon substrate: an AlN layer having a thickness of j nm and an $Al_dGa_{1-d}N$ (where d<c) layer having a thickness of r nm, the average Al content of a unit being u, where u>v and u<w;
the GaN layer 9 consists of a carbon doped GaN layer 9a having a carbon concentration of $4 \times 10^{19}$ atoms/cm$^3$ and a thickness of 1000 nm and an unintentionally doped GaN layer 9b having a thickness of 400 nm; and
the device layer 10 consists of an AlGaN barrier layer 10a having an Al content of 25% and a thickness of 25 nm and an in-situ SiN passivation layer 10b.

In principle, a p-doped AlGaN (Al content ranging from 0 to 30%) can be deposited on top of the AlGaN barrier layer 10a to fabricate e-mode HEMT devices.

A heteroepitaxial wafer with a structure according to FIG. 4 and having the above-mentioned composition was produced within a commercial MOCVD tool from Veeco Instruments, USA, in accordance with the invention, and the curvature of the layered substrate was monitored during the growth of the layers.

Figure 5:
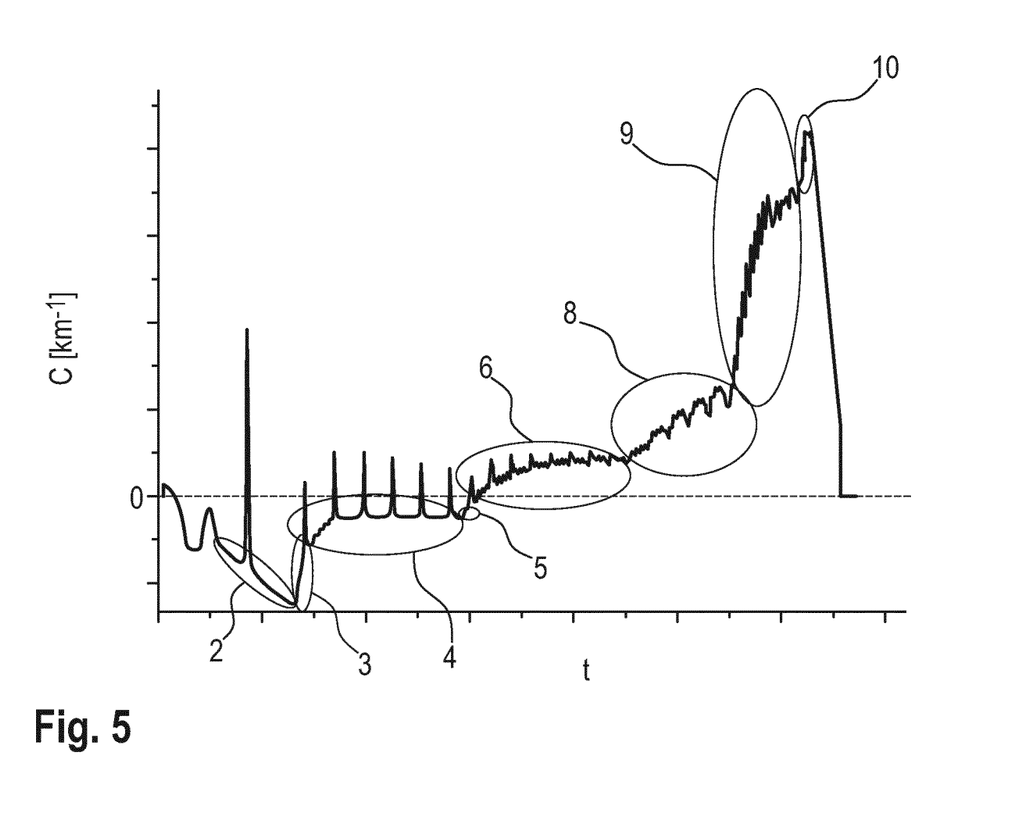
FIG. 5 shows the progression of the curvature C of the layered substrate over time tin the course of the deposition of an epi layer displayed in FIG. 4.

FIG. 5 shows the progression of the curvature C of the layered substrate over time t in the course of the deposition of the epi layer on the silicon substrate, wherein 0 denotes the borderline between concave (negative) and convex (positive) deformation.

Figure 6:
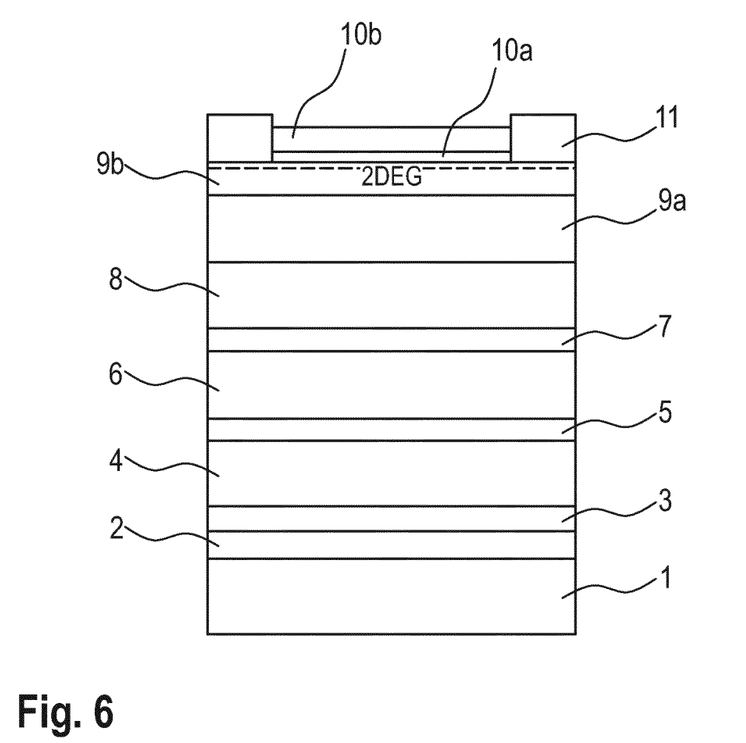
FIG. 6 displays the structure of a device based on the heteroepitaxial wafer according to FIG. 4 and used for measuring the dispersion performance of the AlGaN buffer.

The dispersion performance of the AlGaN buffer was measured using the methodology as described by S. Stoffels et al. (The physical mechanism of dispersion caused by AlGaN/GaN buffers on Si and optimization for low dispersion, 2015 IEEE International Electron Devices Meeting (IEDM), 2015, p. 35.4.1-35.4.4). Metal pads 11 with a spacing of 10 µm have been deposited as shown in FIG. 6 to measure the 2DEG (two-dimensional electron gas) resistance. A voltage of −600 V ($V_{stress}$) was applied as electrical stress on the backside of Si substrate for 10 s (stress stage). Then the stress was removed and a sensing voltage of 1 V was applied over the 2DEG resistor (recovery stage). The switching delay between stress stage and recovery stage was 1 ms. The ratio of the initial 2DEG resistance of the unstressed device to the values measured after stress removal was nearly 1. Accordingly, there was no change in 2DEG conductivity and the AlGaN buffer induced dispersion was almost 0%. Moreover, a Van der Pauw hall measurement was carried on the device shown in FIG. 6 at room temperature with the following results: sheet resistance 425 Ω/sq, carrier density $9.76 \times 10^{12}$ cm$^{-2}$ and carrier mobility 1466 cm$^2$/Vs.

Next, the breakdown performance was examined. For this purpose, a further heteroepitaxial wafer was produced having the AlGaN buffer structure according to FIG. 4 except of the third strain building layer 7, the AlGaN barrier layer 10a, the SiN passivation layer 10b and metal pads 11.

The heteroepitaxial wafer had the following structure:
a (111)-oriented silicon single crystal wafer as substrate 1 with a diameter of 150 mm and a thickness of 675 µm;
an AlN nucleation layer 2 with a thickness of 200 nm;
a first strain building layer 3, namely a $Al_zGa_{1-z}N$ layer with a thickness of i nm;
a first strain preserving block 4, namely 25 repeated units of the first sequence of layers, the layers of a unit with the following order with respect to increasing distance to the silicon substrate: an AlN layer with a thickness of j nm, an $Al_aGa_{1-a}N$ layer with a thickness of k nm, a continuously graded AlGaN layer with a thickness of l nm and with an Al content decreasing from a % to b %, and an $Al_bGa_{1-b}N$ layer with a thickness of m nm;
a second strain building layer 5, namely an $Al_xGa_{1-x}N$ layer with a thickness of n nm;
a second strain preserving block 6, namely 36 repeated units of the second sequence layers, the layers of a unit with the following order with respect to increasing distance to the silicon substrate: an AlN layer with a thickness of j nm and an $Al_cGa_{1-c}N$ layer with a thickness of p nm;
a superlattice block 8 with 41 repeated units of layers, the layers of a unit with the following order with respect to increasing distance to the silicon substrate: an AlN layer with a thickness of j nm and an $Al_dGa_{1-d}N$ layer with a thickness of r nm;
a carbon doped GaN layer 9a with a carbon concentration of $4 \times 10^{19}$ atoms/cm$^3$ and a thickness of 1000 nm; and
an unintentionally doped GaN layer 9b with a thickness of 300 nm.

The total thickness of the epi layer was 4.5 µm (200 nm AlN layer 2, 1800 nm layers 3, 4, 5 and 6, 1200 nm superlattice block 8, 1000 nm carbon doped GaN layer 9a, and 300 nm unintentionally doped GaN layer 9b.

For the purpose of comparison, a heteroepitaxial wafer not representing the invention was grown which differed to the further heteroepitaxial wafer merely with regard to the first and second strain preserving blocks 4 and 6 which had been omitted. To compensate for the first and second strain preserving blocks 4 and 6, the thickness of the superlattice block 8 had been enlarged, respectively. The total thickness of the epi layer was also 4.5 µm (200 nm AlN layer 2, 100 nm AlGaN 3, 2900 nm superlattice block 8, 1000 nm carbon doped GaN layer 9a, and 300 nm unintentionally doped GaN layer 9b.

Figure 7:
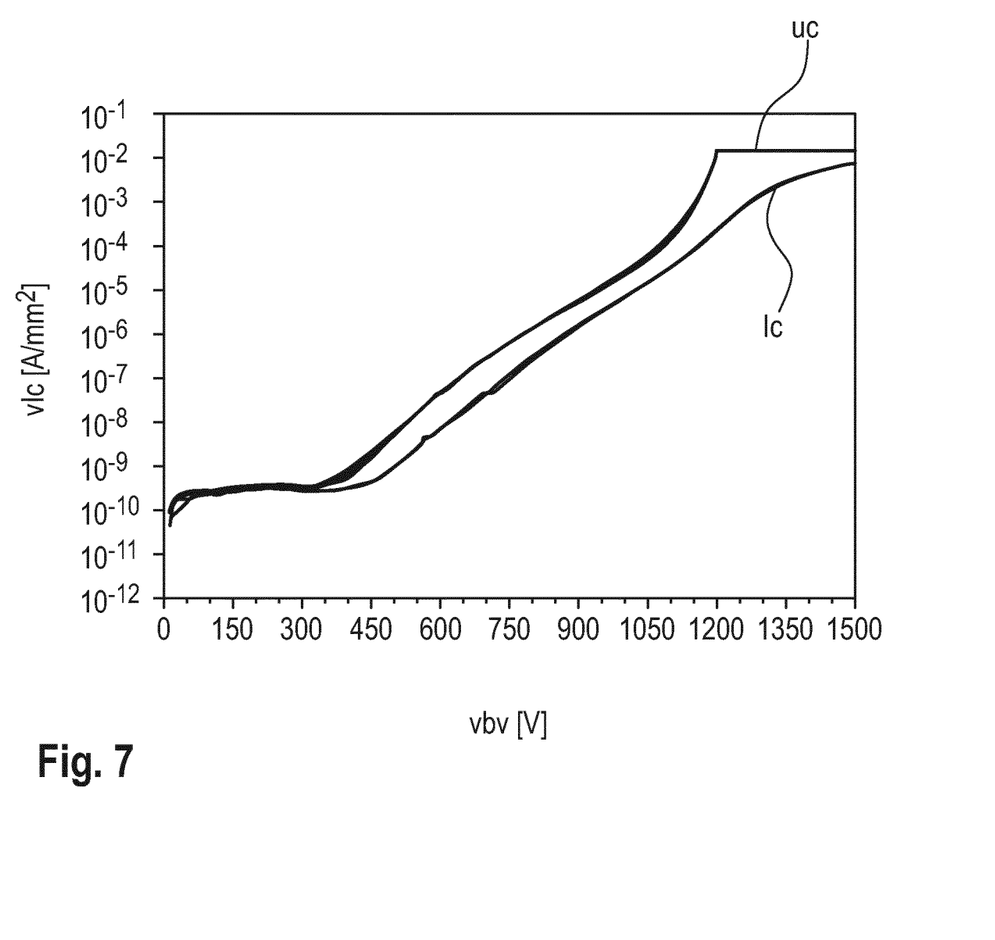
FIG. 7 displays breakdown curves obtained from a heteroepitaxial wafer according to the invention and from a heteroepitaxial wafer used as a comparative example.

FIG. 7 displays breakdown curves obtained from the further heteroepitaxial wafer according to the invention and from the heteroepitaxial wafer used as a comparative example after the provision of 500 µm×500 µm contact pads on top of the GaN layer and the bottom of the silicon substrate. The curves displayed represent the vertical leakage current vlc over the vertical bias voltage vbv. The upper curves (uc) were obtained from the further heteroepitaxial wafer, whereas the lower curves (lc) were obtained from the heteroepitaxial wafer used as comparative example.

At 600 V bias, the leakage current obtained from the further heteroepitaxial wafer was almost an order less than the leakage current obtained from the heteroepitaxial wafer used as a comparative example. The further heteroepitaxial wafer suffered a hard breakdown of the AlGaN buffer not up to 1500 V.

The invention claimed is:

1. A heteroepitaxial wafer comprising, in the following order a), b), c), d), e), f), optionally g), optionally h), and i):
   a) a silicon substrate having a diameter and a thickness;
   b) an AlN nucleation layer;
   c) a first strain building layer which is an $Al_zGa_{1-z}N$ layer having a first average Al content z, wherein 0<z;
   d) a first strain preserving block comprising not less than 5 and not more than 50 units of a first sequence of layers the first sequence of layers of each unit comprising
   d1) an AlN layer and
   d2) at least two AlGaN layers differing with regard to their Al content, one AlGaN layer of the first sequence of layers being a continuously graded composition AlGaN layer, wherein the layers of the first sequence of layers have an Al content which decreases within the units with increasing distance of the layers from the silicon substrate and wherein the first strain preserving block having a second average Al content y, wherein y>z;
   e) a second strain building layer which is an $Al_xGa_{1-x}N$ layer having a third average Al content x, wherein 0<x<y;
   f) a second strain preserving block comprising not less than 5 and not more than 50 units of a second sequence of layers, the second sequence of layers of each unit comprising
   f1) an AlN layer and
   f2) at least one AlGaN layer, the second strain preserving block having a fourth average Al content w, wherein x<w<y, and
   g) optionally, a third strain building layer which is an $Al_vGa_{1-v}N$ layer having a fifth average Al content v, wherein 0<v<w,
   h) optionally, a superlattice block containing AlN and AlGaN layers, the superlattice block having a sixth average Al content u, wherein u>v and u<w,
   i) a GaN layer, wherein the layers between the AlN nucleation layer according to b) and the GaN layer form a buffer layer.

2. The heteroepitaxial wafer of claim 1, wherein the buffer layer has a thickness of not less than 1.0 µm and not more than 5 µm.

3. The heteroepitaxial wafer of claim 1, wherein the buffer layer has an average Al content of not less than 30%.

4. The heteroepitaxial wafer of claim 2, wherein the buffer layer has an average Al content of not less than 30%.

5. A heteroepitaxial wafer of claim 1, wherein the buffer layer further comprises the third strain building layer which is the $Al_vGa_{1-v}N$ layer having the fifth average Al content v, wherein 0<v<w.

6. A heteroepitaxial wafer of claim 5, wherein the buffer layer further comprises the superlattice block, the superlattice block having the sixth average Al content u, wherein u>v and u<w.

7. A heteroepitaxial wafer of claim 1, wherein the diameter and the thickness of the substrate are 150 mm and not more than 1000 µm, respectively; or 200 mm and not more than 1200 µm, respectively; or 300 mm and not more than 1500 µm, respectively.

8. A heteroepitaxial wafer of claim 1, wherein the buffer layer has a breakdown strength of not less than 2.5 MV/cm.

9. A heteroepitaxial wafer of claim 1, wherein the silicon substrate is a silicon single crystal wafer, an SOI wafer or a layered wafer having a silicon single crystal top layer.

10. A method for producing a heteroepitaxial wafer of claim 1, the method comprising the following steps in the order given:
   a) providing a silicon substrate having a diameter and a thickness, and depositing a multiplicity of layers on the silicon substrate, thereby forming a layered substrate, wherein depositing comprises:
   b) depositing an AlN nucleation layer on the silicon substrate;
   c) depositing on the AlN nucleation layer a first strain building layer which is an $Al_zGa_{1-z}N$ layer having a first average Al content z, wherein 0<z;
   d) depositing on the first strain building layer a first strain preserving block comprising not less than 5 and not more than 50 units of a first sequence of layers wherein the layers of the first sequence of layers have an Al content which decreases within the units with increasing distance from the silicon substrate, the first sequence layers of each unit comprising d1) an AlN layer and d2) at least two AlGaN layers differing with respect to their Al content, one AlGaN layer of the first sequence of layers being a continuously graded composition AlGaN layer, the first strain preserving block having a second average Al content y, wherein y>z;
   e) depositing on the first strain preserving block a second strain building layer which is an $Al_xGa_{1-x}N$ layer having a third average Al content x, wherein 0<x<y;
   f) depositing on the second strain building layer a second strain preserving block comprising not less than 5 and not more than 50 units of a second sequence of layers, the second sequence of layers of each unit comprising an AlN layer and at least one AlGaN layer, the second strain preserving block having a fourth average Al content w, wherein x<w<y; and
   g) optionally depositing a third strain building layer which is an $Al_vGa_{1-v}N$ layer having a fifth average Al content v, wherein 0<v<w, and
   h) optionally depositing a superlattice block containing AlN and AlGaN layers, the superlattice block having a sixth average Al content u, where u>v and u<w;
   depositing a GaN layer on the second strain preserving block, or on the third strain building layer when present, or on the superlattice block when present.

11. The method of claim 10, further comprising performing the step of depositing the first strain preserving block at a point in time when the curvature of the layered substrate is concave, and performing the step of depositing the second strain preserving block at a point in time when the curvature of the layered substrate is convex.

12. The method of claim 10, further comprising increasing the curvature of the layered substrate during the deposition of the first strain preserving block and stopping the growth of the first strain preserving block when the value of $\Delta C/\Delta th$ becomes less than $-5$ km$^{-1}$/µm, wherein $\Delta C/\Delta th$ denotes the change of curvature $\Delta C$ with change of thickness $\Delta th$.

13. The method of claim 11, further comprising increasing the curvature of the layered substrate during the deposition of the first strain preserving block and stopping the growth of the first strain preserving block when the value of $\Delta C/\Delta th$ becomes less than $-5$ km$^{-1}$/µm, wherein $\Delta C/\Delta th$ denotes the change of curvature $\Delta C$ with change of thickness $\Delta th$.

14. The method of claim 10, further comprising stopping the growth of the second strain preserving block when the value of $\Delta C/\Delta t$ becomes less than $-1$ km$^{-1}$/µm, wherein $\Delta C/\Delta th$ denotes the change of curvature $\Delta C$ with change of thickness $\Delta th$.

15. The method of claim 10, further comprising starting the deposition of the GaN layer at a point in time when the curvature of the layered substrate is convex and not more than 50 km$^{-1}$.

16. The method of claim 10, wherein the silicon substrate has a diameter of 150 mm and a thickness of not more than 1000 µm, respectively; or a diameter of 200 mm and a thickness of not more than 1200 µm, respectively; or a diameter of 300 mm and a thickness of not more than 1500 µm, respectively.

* * * * *